United States Patent [19]

Wolber et al.

[11] 4,303,962

[45] Dec. 1, 1981

[54] ELECTRICAL CONTACT ARRANGEMENT FOR A BATTERY-OPERATED INSTRUMENT

[75] Inventors: Robert Wolber; Roland Maurer, both of Lauterbach; Peter Jesse, Schramberg, all of Fed. Rep. of Germany

[73] Assignee: Gebruder Junghans GmbH, Schramberg, Fed. Rep. of Germany

[21] Appl. No.: 68,620

[22] Filed: Aug. 22, 1979

[30] Foreign Application Priority Data

Sep. 12, 1978 [DE] Fed. Rep. of Germany ....... 7827031

[51] Int. Cl.$^3$ .............................................. H05K 7/14

[52] U.S. Cl. .................................... 361/399; 361/407; 368/69; 362/23

[58] Field of Search .................. 307/150, 157; 368/67, 368/69, 204, 227; 362/23, 29, 103, 104, 200, 201; 361/380, 392, 395, 399, 400, 404, 407

[56] References Cited

U.S. PATENT DOCUMENTS 2,875,320 2/1959 Campbell ............................ 362/23

3,911,663 10/1975 Kern .................................. 368/204

4,068,464 1/1978 Barnett ................................ 368/69

*Primary Examiner*—Gerald P. Tolin

*Attorney, Agent, or Firm*—Burns, Doane, Swecker & Mathis

[57] ABSTRACT

A contact arrangement for a battery-operated instrument, especially a battery-operated clock, having a housing made of synthetic material. Two contact elements are provided for making connection between the two terminals of a battery and two respective paths of a circuit board. One of the contact elements includes a bus portion fastened to the housing, and a pair of legs. A first leg makes contact with one terminal of the battery and the second leg makes contact with a path of the circuit board. The second leg is designed in the form of a knife-edge contact, one portion thereof bearing against a wall of the housing, and another portion thereof bearing against the circuit board. The second leg thus holds the circuit board in its inserted position by mechanical force. The contact element further includes a third leg which electrically contacts as well as mechanically clamps a small bulb when the latter is inserted into the housing.

5 Claims, 7 Drawing Figures

ELECTRICAL CONTACT ARRANGEMENT FOR A BATTERY-OPERATED INSTRUMENT

RELATED APPLICATIONS

The related disclosures of the following copending U.S. applications, filed simultaneously herewith, are incorporated herein by reference as if set forth at length:

1. U.S. Application Ser. No. 68591 by Robert Wolber et al. (corresponding to German Application No. G 78 27 035.6 filed Sept. 12, 1978).
2. U.S. Application Ser. No. 68590 by Robert Wolber et al. (corresponding to German Application No. G 78 27 030.1 filed Sept. 12, 1978).
3. U.S. Application Ser. No. 68619 by Hans Flaig et al. (corresponding to German Application No. P 28 39 611.4-34 filed Sept. 12, 1978).
4. U.S. Application Ser. No. 68598 by Roland Maurer (corresponding to German Application No. G 78 27 034.5 filed Sept. 12, 1978).
5. U.S. Application Ser. No. 68597 by Udo Schultheiss (corresponding to German Application No. G 78 27 033.4 filed Sept. 12, 1978).
6. U.S. Application Ser. No. 68595 by Friedrich Assmus (corresponding to German Application No. P 28 39 554.2-31 filed Sept. 12, 1978).
7. U.S. Application Ser. No. 68596 by Robert Wolber et al. (corresponding to German Application No. P 28 39 555.3-31 filed Sept. 12, 1978).

BACKGROUND AND OBJECTS OF THE INVENTION

The invention concerns a contact arrangement for battery-powered instruments such as clocks, for example, and more particularly to a contact arrangement for electrically connecting the battery with a circuit board component of the instrument.

A contact arrangement for battery-powered instruments is known from registered German Gebrauchsmuster Patent No. 73 27 047. Each of the two contact elements used in that arrangement has only one function, namely to connect electrically one terminal of the battery with one associated electrical path of a circuit board. These contact elements engage the circuit board by means of legs, the circuit board being mounted by way of fastening elements with other plates. If it becomes necessary to replace the circuit board, it is necessary to first detach the two contact elements from their mountings, and then loosen the fastening elements which hold the circuit board in place. It would be desirable to simplify such a procedure.

It is, therefore, an object of the present invention to provide a contact arrangement which makes feasible a simple assembly, or disassembly, of a circuit board.

It is another object of the invention to provide a contact arrangement which not only establishes electrical connection between a battery and electrical tracks of the board, but which also locks the circuit board and at least one additional component of the instrument within the housing by mechanical force.

BRIEF SUMMARY OF THE INVENTION

These objects are accomplished by providing a battery contact element comprising a bus portion which can be fastened to an instrument housing and a pair of legs projecting from the bus portion. A first leg contacts one terminal of the battery and an electric path on a circuit board. The second leg is in the form of a knife-edge contact and includes a first portion bearing against a wall of the housing, a second portion bearing against an electric path of the circuit board. A third leg bears against the threads of a light bulb which is inserted through a hole in the housing, to make electrical connection with the bulb and retain it within the housing. Such arrangement of the circuit board within the housing of the instrument, and the design of the second leg of the contact element in the form of a knife-edge contact, makes it possible to insert into, or respectively remove from the housing a circuit board by practically one single manual operation. Since the second leg exerts a force toward the circuit board, the board is pressed against guide ribs which limit lateral movement of the board. Thus, the board will be held in its installed position without the need for additional fastening elements. The same applies to a small bulb which is mechanically clamped as well as electrically contacted by the third leg of the contact element which engages screw threads of the bulb socket.

THE DRAWING

A preferred embodiment of the invention will be described below in detail on the basis of a clock which is illustrated by the accompanying drawing in which:

FIG. 1 shows a clock without the rear section of the housing and without the battery, FIG. 2 shows one side of a circuit board in top view with components fastened thereto, FIG. 3 is a front view of a contact element according to the invention, FIG. 4 is a top view of the contact element, FIG. 5 is a side view of the contact element, FIG. 6 is a partial rear view of the clock with the battery inserted but without the clockwork and dividing plate, and FIG. 7 is a partial sectional view through the clock along line VII—VII in FIG. 6.

DETAILED DESCRIPTION OF A PREFERRED EMBODIMENT OF THE INVENTION

Figure 1:
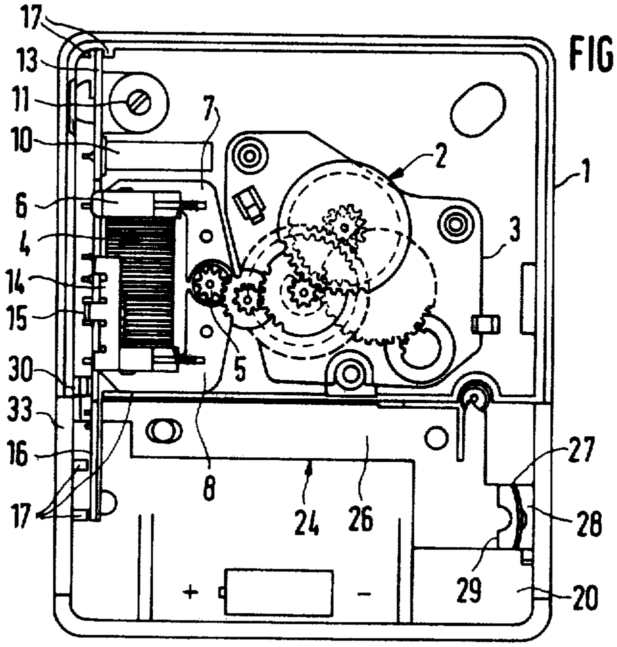

A clock, illustrated in the drawing as an example of a battery-operated instrument in which the present invention may be utilized, has a housing which is formed by a front section 1 and a rear section (not illustrated). Both sections of the housing are made of synthetic material and are connected with each other by means of conventional locking projections and recesses which are formed on these sections.

Numeral 2 denotes a clockwork for the drive of the clock hands. The component parts of the clockwork are mounted within the area between the bottom of the front section 1 of the housing and a dividing plate 3 as well as within the area between this plate and the bottom of the rear section of the housing at suitable designed bearings.

Figure 2:
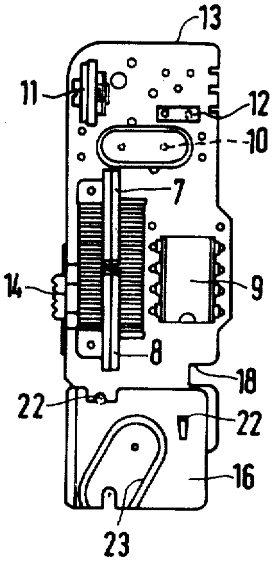

A stepping motor 4 is provided for the drive of this clockwork 2, its rotor 5 carrying a pinion which engages the teeth of the first wheel of the clockwork. The rotor 5 is supported in axially aligned mounts of the two housing sections while the static components of the stepping motor 4, viz., a coil 6 and two stacks of stator laminations 7, 8 are fastened to a circuit board 13, along with the elements of an electronic circuitry, namely an integrated circuit 9, a quartz resonator 10, a trimmer capacitor 11 and a fixed capacitor 12 (FIG. 2). Also fastened to the circuit board 13 is a slide switch 14 which can move across one edge of the board. Depending on its position, the slide switch can shunt by means of an attached spring contact 15 two paths (not illustrated) of the board for the purpose of breaking or making the pulse feed from the integrated circuit 9 to the coil 6 of the stepping motor 4.

Also arranged on the circuit board 13 is a contact element 16 which forms a portion of the contact arrangement. The components 6 to 12, 14 and 16 form, in conjunction with the circuit board 13, an insertable module that can be assembled externally of the housing, pushed via one manual operation into the housing section 1 and inserted into suitably designed retaining elements. The latter comprise a pair of supporting ribs 17 at the top wall of the housing section 1 which retain the circuit board 13 laterally, and additional supporting ribs 17 on a side wall 33 of the housing section 1 against which the circuit board may bear. The inserted circuit board is secured in longitudinal direction by a transversal rib (not visible in the drawing) at the bottom of the housing section 1 which engages a correspondingly molded locking groove 18 (see FIG. 2) of the circuit board.

The clock is supplied with current by a battery 19 which is inserted into a recess 20 of the housing section 1.

The two terminals of the battery 19 are connected by means of the novel contact arrangement which will now be explained in detail.

A first contact element 16, previously mentioned, is designed as a battery contact plate and functions to connect the positive terminal 21 of the battery 19 with the appropriate paths of the circuit board 13. This contact element 16 is designed in the form of a punched-out, flexible metal part soldered to the appropriate paths by way of angled lugs 22 thereon which pass through bores of the circuit board. This contact element 16 is further provided with a groove 23 which is inclined toward the bottom of the housing section 1 and which accommodates the protruding positive terminal 21 of the battery 19. This specific design of the groove 23 is used in order to minimize any necessary changes if a smaller battery is being used, for example a "mignon" cell in place of the "baby" cell illustrated here because only the battery area 20 and a second contact element 24 will require slight adjustments, with the lay-out of the clock remaining unchanged in other respects.

Figure 3:
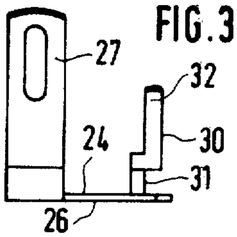
Figure 4:
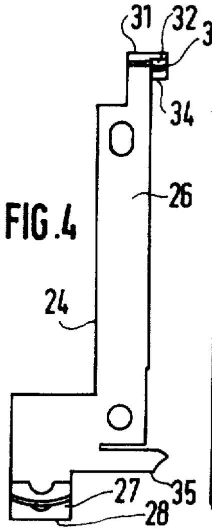
Figure 5:
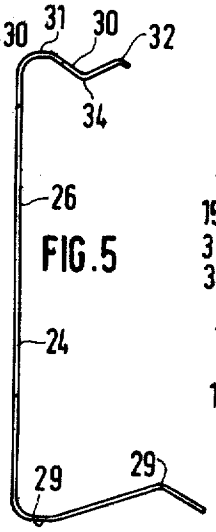
Figure 6:
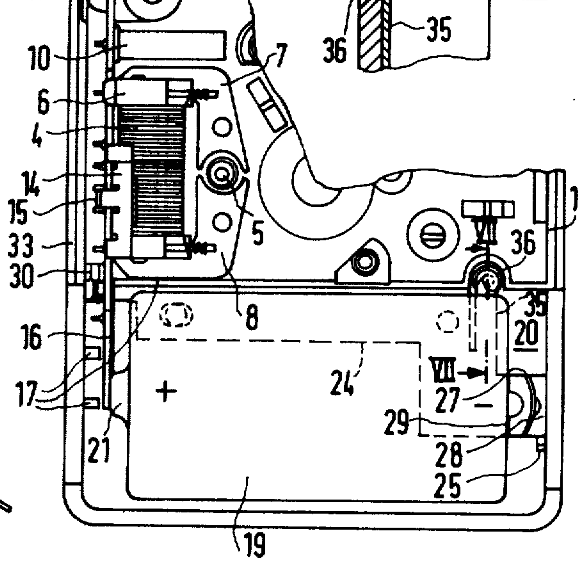
Figure 7:
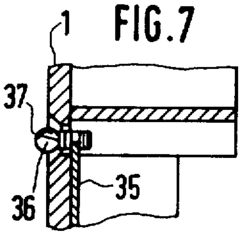

The above-mentioned second contact element 24 has the function of connecting the negative terminal 25 of the battery 19 with the appropriate path of the circuit board 13. This contact element 24, which is illustrated in detail in FIGS. 3 to 5, is also designed in the form of a punched-out, flexible metal part and consists of a flat bus portion 26, fastened at the bottom of housing section 1, and several legs projecting out from it. A first of the legs 27 is S-shaped and includes a portion 28 which bears against a wall of the front section 1 of the housing while its other portion 29 abuts the negative terminal 25 of the battery 19. A second leg 30, formed in S-shape, is also formed on the bus 26. In accordance with the present invention, this second leg 30 is designed in the form of a knife-edge contact for the purpose and function of electrically contacting the circuit board 13, inserted into the housing, as well as to holding the same by mechanical force in its inserted position. This S-shaped leg 30 includes two portions 31 and 32 which abut a wall 33 of the front section 1 of the housing and another portion 34 which engages the circuit board 13, the latter having been inserted into the housing parallel with the wall 33. Specifically, the portion 34 contacts the appropriate path of the circuit board which within this region of contact, has a widened contact surface.

The portion 34 rests initially under compression at the frontal area of the supporting ribs 17 which borders the battery area. During the insertion of the circuit board 13 into the housing, this portion 34 of the leg 30 is deflected toward the wall 33. A force component between the wall 33 and the circuit board 13 is thereby generated which presses the latter against some of the upper supporting ribs 17.

The circuit board 13 is thus held within the casing without the use of additional fastening means.

A third leg 35 is also formed on the bus 16 of the second contact element 24. This third leg 35 lies in the same plane as the bus 26 and forms a laterally protruding spring contact. The outer free end of the leg 35 engages a screw thread of the screwed holder of a small bulb 36 with a slight spring action. This bulb, serving for example to illuminate the display, can be inserted through an opening 37 of the housing section 1. During this insertion, the leg 35 will ratch across the screw threads. When the small bulb has reached its final position, it is electrically connected to, as well as mechanically clamped by, the leg 35.

Although the invention has been described in connection with a preferred embodiment thereof, it will be appreciated by those skilled in the art that additions, substitutions, modifications, and deletions not specifically described may be made without departing from the spirit and scope of the invention as defined in the appended claims.

What is claimed is:

1. A contact arrangement in a battery-powered instrument of the type comprising a housing made of synthetic material and including at least one wall, a circuit board disposed within said housing parallel to said wall, electric light bulb means including a screw threaded socket secured within said housing, and a recess within said housing for receiving a battery, said contact arrangement comprising a bus portion fastened to said housing, said bus portion having at one end a first leg with means for making contact with a terminal of a battery to be seated in said recess, said bus portion having at another end a second leg having a knife contact in contact with a circuit path on said circuit board, said bus portion including a third leg contacting said threaded bulb socket under spring action to establish electrical connection therewith.

2. A contact arrangement according to claim 1, wherein said third leg engages the screw threads of said bulb socket in a manner retaining said socket in said housing.

3. Apparatus according to claim 2, wherein said bus portion is flat, the third leg arranged within the same plane as the bus portion and including an outer free end which engages said bulb means.

4. A contact arrangement according to claim 2, wherein said third leg extends transverse relative to the longitudinal direction of said bus portion and in a direction away from said battery recess.

5. A contact arrangement according to claim 4, wherein said first and second legs are S-shaped.

* * * * *